Aug. 30, 1960

J. A. ROBINSON 2,951,210

AUTOMATIC GAIN CONTROL SYSTEM

Filed May 19, 1958

INVENTOR
J. A. ROBINSON
By W. C. Parnell
ATTORNEY

United States Patent Office 2,951,210

Patented Aug. 30, 1960

2,951,210

AUTOMATIC GAIN CONTROL SYSTEM

John A. Robinson, Andover, Mass., assignor to Western Electric Company, Incorporated, New York, N.Y., a corporation of New York Filed May 19, 1958, Ser. No. 736,140

8 Claims. (Cl. 331—40)

Figure 1:
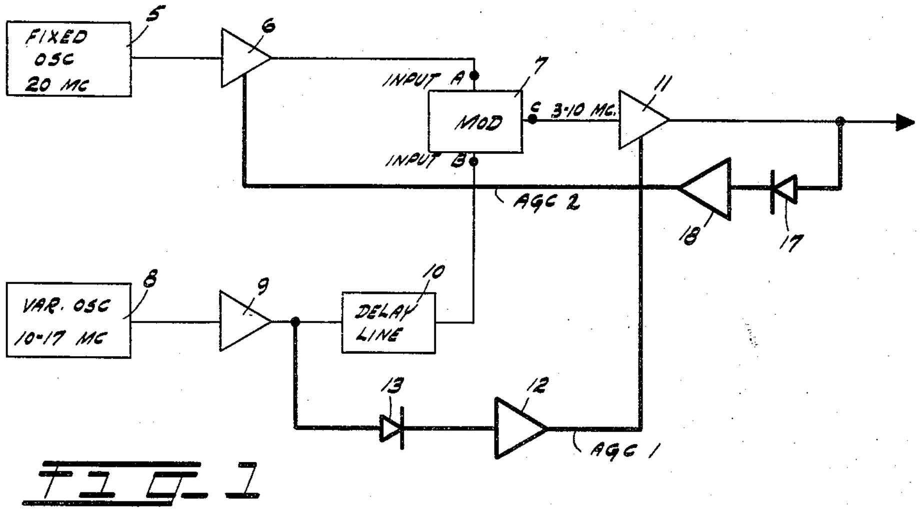

This invention relates to automatic gain control systems and particularly to a control for a dual signal system such as, for example, a heterodyne type sweep oscillator.

Most automatic volume or gain control systems employed in radio and telephony utilize relatively long time constant circuits in which the response time for the control action is of little importance since the amplitude or level correction is usually made inversely proportional to an average value of a detected signal. The control action then keeps the output level substantially constant over a wide band of frequencies. Response time consideration becomes important in systems where two signals are mixed or modulated and the frequency of at least one of the signals is variable, and as such is generally the source of most of the objectionable level variation, such as in a heterodyne sweep frequency oscillator. In the event a long time constant automatic gain control circuit is employed, the level correction may not be made at the frequency at which it is needed. In the case where the output of the variable signal source is irregular and the response curve has hills and dales across the frequency band, conventional gain control systems may worsen rather than improve the condition.

Accordingly, it is the object of this invention to attain coincidence in time between the cause and effect of control action in such systems.

Another object is to synchronize the automatic gain control action in such dual frequency systems with the variation in signal level causing such action so that the modulation product corresponding thereto is corrected at the proper time.

Another object is an automatic gain control for a sweep frequency oscillator of the heterodyne type.

According to the general features of the invention, in an automatic gain control for a system having a mixing device with at least two signal inputs, an automatic gain control signal is derived from and correspondingly varies with the level of either of the inputs, normally the one most susceptible to level variations, and the automatic gain control signal is used to control the amplitude or level of the output of the mixing device, means being provided to synchronize the operation of the gain control signal with the output of the mixing device to attain the best possible coincidence in time between the cause and effect of the control action.

As applied to a heterodyne type sweep frequency oscillator having a fixed frequency oscillator and a variable frequency oscillator, a forward-acting automatic gain control derives a control signal from the output of the variable oscillator for controlling the level of the modulation product in the output of the modulator in inverse proportion to the oscillator signal level. The response time of the automatic gain control circuit is made substantially the same as the time delay of the circuit between the variable oscillator output and the modulator output by the inclusion of a delay line in one of the circuits.

According to a feature of the invention in conjunction with the forward-acting gain control, a backward-acting automatic gain control is provided from the output of the modulator for controlling the level of the fixed frequency oscillator, thereby compensating for variations in its output.

Figure 2:
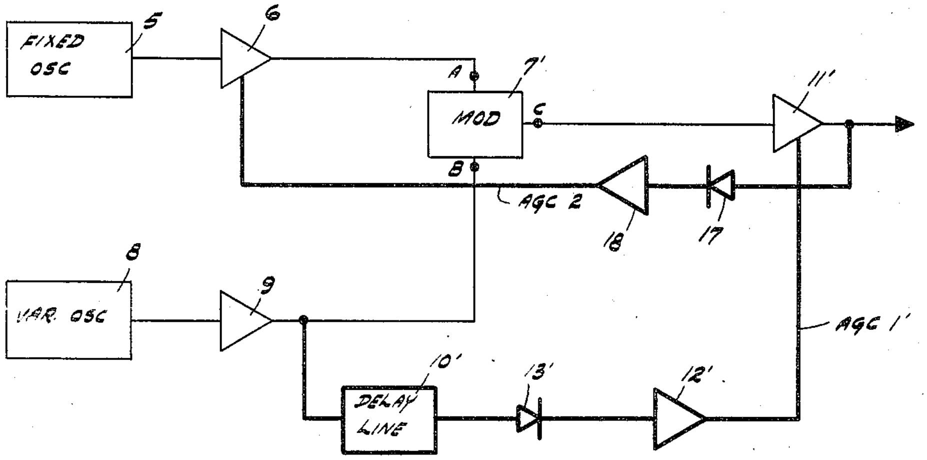

These and other features of the invention will be more fully understood from the following detailed description when taken in conjunction with the accompanying drawings, in which:

Fig. 1 is a schematic diagram of a heterodyne type sweep oscillator incorporating the general features of the invention, and Fig. 2 is an alternate diagram of such a heterodyne oscillator wherein the response time of the automatic gain control circuit is less than the time delay between the output of the variable oscillator and the output of the modulator. Like numerals designate identical components in the two figures.

As seen in Fig. 1, a heterodyne oscillator circuit for producing an output signal varying between 0.3 to 10 megacycles includes a fixed frequency oscillator 5 having a twenty-megacycle output which feeds through a buffer amplifier 6 to one input "A" of modulator 7. The other input "B" is energized from the 10 to 19.7 megacycle signal from a variable frequency oscillator 8 which passes through a buffer amplifier 9 and a delay line 10. The delay line 10 is used for synchronizing the timing of the automatic gain control system and is not normally found in heterodyne sweep frequency oscillators. Its function will be explained below. The output circuit of the modulator includes an amplifier 11 which passes the 0.3 to 10 megacycle lower side band modulation product.

The gain control circuitry is shown in extra heavy lines in the drawing. A forward-acting automatic gain control circuit designated "AGC–1" is connected between buffer amplifier 9 in the variable oscillator input circuit to the modulator and the output amplifier 11. In this circuit a control signal is derived from and varies directly with the level or amplitude of the variable frequency signal, and is rectified by a diode 13. The resulting unidirectional signal is amplified in amplifier 12 and the output thereof is applied to the grid circuit of amplifier 11 in the output of the modulator to regulate the gain of amplifier 11 in inverse proportion to the variable frequency signal strength.

This gain control circuit is included in the variable oscillator circuit, since the variable oscillator is the usual source of level variations in such sweep frequency oscillators, it being relatively simple to design a stable fixed frequency oscillator. Variations in the signal output of the variable oscillator 8 are not immediately reflected in the output of the amplifier 11 due to the delay time or response times of the amplifier 9, the modulator 7, and the amplifier 11. In order to provide the gain correction at the frequency that needs the level correction, the delay line 10 is utilized and equalizes the time delay in the signal from the output of the amplifier 9 through the amplifier 11 with the response time or time delay of the automatic gain control circuit "AGC–1." Two different situations are possible, one as illustrated in Fig. 1 where, due to the particular circuitry and circuit elements utilized, the signal advances more quickly through the modulator 7 and the amplifier 11 than through the gain control circuit "AGC–1." Consequently, the delay line is inserted between the buffer amplifier 9 and the input to the modulator to retard the signal through the modulator 7 and the amplifier 11 in order to synchronize the automatic gain control of "AGC–1" with the signal at amplifier 11. In the other situation, as illustrated in Fig. 2, where different circuitry or circuit elements (distinguished from those of Fig. 1 by prime numerals) are used, the time delay through the modulator 7′ and output amplifier 11′ is greater than the time delay through the automatic gain control circuit "AGC-1'" (that is, without the delay line 10' connected in the circuit). In order to retard the action of the automatic gain control to synchronize the automatic gain control of "AGC-1'" with the signal at amplifier 11', a delay line 10' is inserted in the automatic gain control circuit. The delay line is well known in the art and may be obtained commercially. The delay time of the delay line, of course, must be selected for substantially equalizing the response times through the two circuits over the variable oscillator frequency band. The selection of the proper delay time of the line may be easily arrived at by trial, by adjusting the delay line and observing the signal trace on an oscilloscope in a conventional manner.

The above described automatic gain control circuits "AGC-1" and "AGC-1'" are quick-response circuits having short time constants so that the level correction on amplifiers 11 and 11', respectively, will follow the modulated signal product corresponding to the level variation in the output of the variable oscillator 8. An auxiliary backward-acting automatic gain control circuit is also incorporated in the systems disclosed in Figs. 1 and 2, and are designated "AGC-2." While, as described above, the output level of the fixed frequency oscillator 5 is relatively stable, still, average level variations may occur. The auxiliary gain control circuit "AGC-2" is utilized to minimize the effect thereof. This gain control circuit is a backward-acting or closed loop type in which a portion of the output of amplifier 11 or 11' is fed through a diode 17, the unidirectional output thereof being amplified in an amplifier 18 so as to produce a unidirectional voltage varying with the amplitude or level of the output signal from the amplifier 11 or 11', which is, in turn, applied to the amplifier 6 to inversely regulate the gain of the amplifier 6. The first mentioned gain control circuits "AGC-1" and "AGC-1'" remove the major portions of the level variations in the modulator output, the second gain control circuit "AGC-2" therefor will have smaller corrections to make and its response time may be, as in most automatic gain or volume control circuits, relatively long.

It is to be understood that the above described arrangements are simply illustrative of the application of the principles of the invention. Numerous other arrangements may be readily devised by those skilled in the art which will embody the principles of the invention and fall with the spirit and scope thereof. For example, three or more oscillator inputs to the modulator could be used with appropriate gain control circuits therefor, using one or more output circuits.

What is claimed is:

1. An automatic gain control for a system having a frequency mixing device with at least two signal input circuits and one output circuit with an output amplifier therein, means for deriving a unidirectional potential having an amplitude corresponding to the amplitude of the signal in one of the input circuits, means controlled by the derived potential for correspondingly varying the gain of the amplifier, and means for equalizing the time delay of the signal from said one of the input circuits to the amplifier and the response time required for the derived potential to vary the gain of the amplifier.

2. A system according to claim 1 in which the equalizing means comprises a delay line connected in said one of the input circuits.

3. A system according to claim 1 in which the equalizing means comprises a delay line in the means for deriving the unidirectional potential.

4. In a signal generating system the combination with a fixed frequency oscillator, a variable frequency oscillator, a modulator having at least two input circuits and at least one output circuit, an amplifier in the output circuit, and means connecting the outputs of the oscillators to the input circuits, of a forward-acting automatic gain control circuit comprising means for deriving from the output of the variable frequency oscillator a unidirectional potential having an amplitude corresponding to the amplitude of the signal of the variable frequency oscillator, means controlled by the derived potential for varying the gain of the amplifier, and means for equalizing the time delay of the signal from the variable oscillator to the amplifier and the response time required for the derived signal to vary the gain of the amplifier.

5. A system according to claim 4 in which the equalizing means comprises a delay line connected between the variable oscillator and the corresponding modulator input circuit.

6. A system according to claim 4 in which the equalizing means comprises a delay line connected in the automatic gain control circuit.

7. A system according to claim 1 having a backward-acting automatic gain control circuit responsive to variations in the amplitude of the signal in the output circuit for varying the amplitude of the signal in the other input circuit.

8. In a sweep frequency signal generating system, the combination with a fixed frequency oscillator, a variable frequency oscillator, a modulator having at least two input circuits and at least one output circuit, an amplifier in the output circuit, a buffer amplifier connected between the output of the fixed frequency oscillator and one of the input circuits, and means connecting the output of the variable frequency oscillator to the other input circuit, of a forward-acting automatic gain control circuit comprising means for deriving from the output of the variable frequency oscillator a unidirectional potential having an amplitude corresponding to the amplitude of the output signal of said oscillator, means controlled by the derived potential for varying the gain of said amplifier, means for equalizing the time delay of the signal from the variable oscillator to the amplifier and the response time of the derived signal for varying the gain of said amplifier, and a backward-acting automatic gain control circuit comprising means for deriving from the output of said amplifier a unidirectional potential having an amplitude corresponding to the amplitude of the output signal of the modulator and means controlled by the derived potential for varying the gain of the buffer amplifier.

References Cited in the file of this patent

UNITED STATES PATENTS 2,859,336 Cluwen ---------------- Nov. 4, 1958